United States Patent [19]

Chiba et al.

[11] Patent Number: 5,253,012
[45] Date of Patent: Oct. 12, 1993

[54] SUBSTRATE HOLDING APPARATUS FOR VERTICALLY HOLDING A SUBSTRATE IN AN EXPOSURE APPARATUS

[75] Inventors: Yuji Chiba, Isehara; Hidehiko Fujioka, Yamato, both of Japan

[73] Assignee: Canon Kabushiki Kaisha, Tokyo, Japan

[21] Appl. No.: 769,974

[22] Filed: Oct. 2, 1991

[30] Foreign Application Priority Data

Oct. 5, 1990 [JP] Japan .................................. 2-266344
Oct. 24, 1990 [JP] Japan .................................. 2-284299

[51] Int. Cl.⁵ .............................................. G03B 27/42
[52] U.S. Cl. ........................................ 355/53; 355/72; 355/75; 355/76
[58] Field of Search ......................... 355/53, 72, 75, 76

[56] References Cited

U.S. PATENT DOCUMENTS 4,662,754  5/1987  Mayer ................................... 355/53
4,764,791  8/1988  Omata et al. ......................... 355/53

Primary Examiner—Monroe H. Hayes
Attorney, Agent, or Firm—Fitzpatrick, Cella, Harper & Scinto

[57] ABSTRACT

A substrate holding apparatus for vertically holding a substrate to be exposed by radiation includes a substrate holding member for attracting a substrate by a magnetic force or vacuum and an engaging device for engaging the substrate on the substrate holding member. The engaging device is retractably supported by or fixed to the substrate holding member, and is engageable with or engages the substrate in such a manner that the engagement between the vertically held substrate and the engaging device is maintained even if the substrate holding member ceases to attract the substrate. Thus, dropping of the substrate by gravitation is prevented even if the substrate ceases to be attracted by the substrate holding member.

16 Claims, 10 Drawing Sheets

SUBSTRATE HOLDING APPARATUS FOR VERTICALLY HOLDING A SUBSTRATE IN AN EXPOSURE APPARATUS

BACKGROUND OF THE INVENTION

1. Field of the Invention

The present invention relates to a substrate holding apparatus or mask stage base in an exposure apparatus such as an X-ray exposure apparatus in which synchrotron radiation light is utilized as an exposure light.

2. Related Background Art

In an X-ray exposure apparatus, an optical axis thereof is substantially parallel to a reference plane or a horizontal, differently from an ordinary exposure apparatus, so that it is required that a mask or substrate and a wafer for exposure be vertically held and that this relationship be maintained.

Figure 1:
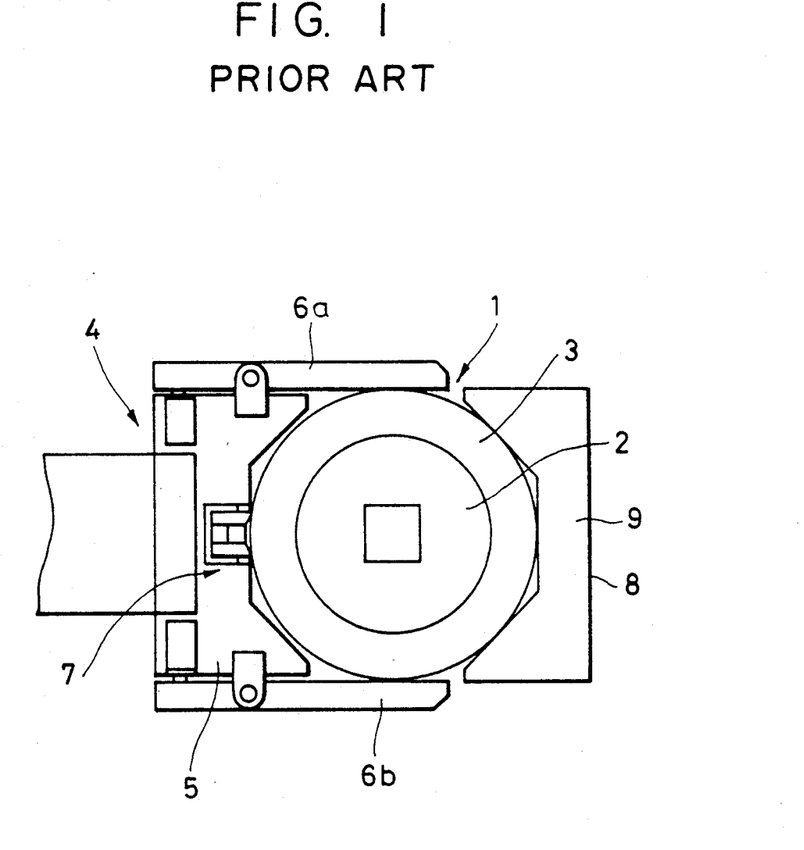
FIG. 1 is a front view showing the structure of a first prior art apparatus.

FIG. 1 shows a mask hand 4 for transporting an X-ray mask 1 and a mask stage 8 to be used as a base holding apparatus, which are used in a prior art X-ray exposure apparatus. In the X-ray mask 1 of FIG. 1, a mask membrane 2 having a mask pattern thereon is fixed to a mask frame 3 containing magnetic material. Mask hand 4 has a hand body 5 and two fingers 6a and 6b pivotally mounted to both sides of the hand body 5. The mask 1 is held by closing the fingers 6a and 6b, and the mask frame 3 is attracted to a magnetic unit 7 fixed to a central portion of the hand body 5. Thus, the X-ray mask 1 is held vertically and is handed to a mask stage 8.

In the mask stage 8, a magnetic unit (not shown) is embedded for engaging or disengaging the X-ray mask 1 with or from a stage surface or substrate holding surface. On the stage surface, a V-block 9 is mounted for indicating a location where the X-ray mask 1 is positioned. The magnetic unit embedded in the stage surface includes a permanent magnet and an electromagnet for generating a magnetic field for offsetting a magnetic field of the permanent magnet when energized. The holding of the mask 1 is performed by the permanent magnet, while the disengagement of the mask 1 is caused by energizing the electromagnet. The prior art technique, however, has the following disadvantages.

In the substrate holding apparatus for holding the substrate for an X-ray exposure, there is a possibility of dropping the substrate since the substrate is vertically held. But, no means for preventing the dropping of the substrate is provided because such means would obstruct the movement of the mask hand 4 and a handling operation of the substrate performed when the substrate is transferred on the mask stage 8, and for other reasons. Therefore, in the case of a mask stage with a magnetic unit, the substrate falls downward by gravitational forces if the electromagnet is erroneously energized when the mask 1 is held. This may result in not only damaging the X-ray mask 1, but also damaging devices located under the mask stage 8. Thus, safety of the substrate holding apparatus cannot be ensured and its reliability is lowered. Further, economic burdens become large because the X-ray mask 1 is expensive.

Figure 2:
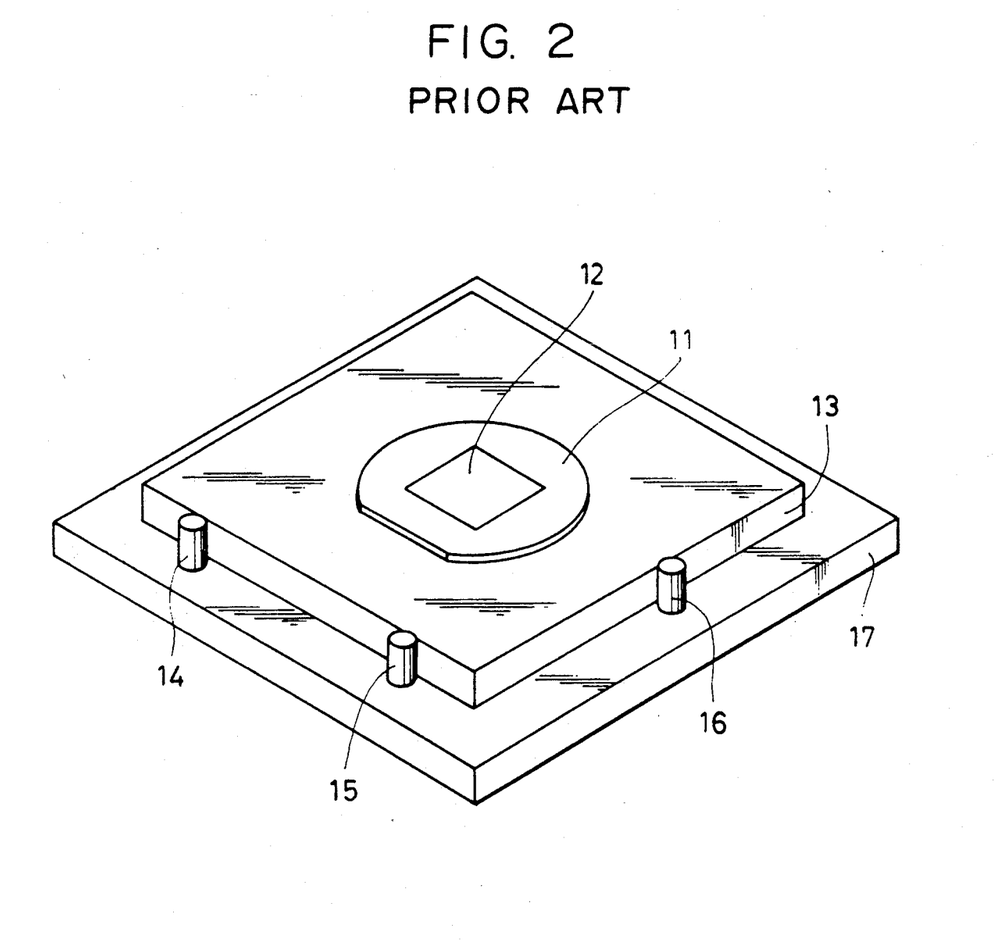
FIG. 2 is a perspective view showing the structure of a second prior art apparatus.

Another prior art mask stage base is shown in FIG. 2. On a mask substrate 11, a highly integrated mask pattern 12 is formed, and the mask substrate 11 is adhered to a supporting frame 13 formed with heat resisting glass, metal or the like, by adhesive. The alignment or positioning of the mask at the time of exposure is conducted by bringing side walls of the supporting frame 13 into contact with each of three positioning pins 14, 15 and 16 studded on a mask stage base 17 on which the X-ray mask structure 11-13 is mounted. After the alignment of the mask structure, the mask structure is held by a vacuum holding mechanism (not shown) provided on the mask stage base 17.

The above-mentioned mask stage base 17 holds the X-ray mask structure horizontally because X-rays for exposure are applied from above. In contrast, in a case when a synchrotron radiation light is used as an X-ray source, it is required that the X-ray mask structure be vertically held by a vertically standing mask stage base due to the structure of a synchrotron radiation apparatus.

In order to position the X-ray mask structure by the prior art positioning mechanism in the above-mentioned condition, the mask structure must be pushed against one positioning pin while pushing the mask against the remaining two pins. But, in order to perform that operation by the transporting equipment, a sophisticated mechanism is needed. Further, while there exists another method for positioning the mask structure by positioning the mask stage base with a six-axis stage without accurately positioning the X-ray mask structure directly, a structure therefor also becomes complicated.

Further, there is a problem that when trouble occurs in a vacuum holding mechanism in the mask stage base of FIG. 2 (for example, a leak occurs in a vacuum line in a vacuum holding system, or an electric source fails in a magnetic attracting system), the X-ray mask structure being held by vacuum ceases to be attracted and falls downward due to its own weight.

SUMMARY OF THE INVENTION

An object of this invention is to provide a substrate holding apparatus in which dropping of a substrate can be prevented for ensuring safety of the apparatus and obtaining a high reliability.

Another object of this invention is to provide a substrate holding apparatus in which dropping of a substrate can be prevented for ensuring safety of the apparatus and obtaining a high reliability, and which can position the substrate accurately without using a complicated mechanism.

According to one aspect of the present invention, a substrate holding apparatus includes a structure for vertically holding a substrate to be exposed by radiation, which is transported by a substrate transporting apparatus having two finger portions for holding the substrate. There are provided a substrate holding surface for attracting a substrate, a drop preventing pin and a drop preventing plate. A block fixed to the substrate holding surface for positioning and supporting the substrate may be provided. The drop preventing pin is biased so as to project above the substrate holding surface for preventing dropping of the substrate by gravitational forces, and this pin is depressed below the substrate holding surface by one of the finger portions of the substrate transporting apparatus when the substrate transporting apparatus moves onto the substrate holding surface. The drop preventing plate is movably supported at and biased toward a home position in which the plate overlaps an upper portion of the substrate attracted by the substrate holding surface for receiving the substrate when leaning to a side opposite to a substrate holding surface, and the plate is retracted from the substrate holding surface (i.e., the home position) by the other one of the finger portions of the substrate transporting apparatus when the substrate transporting apparatus moves onto the substrate holding surface.

According to another aspect of the present invention, a substrate holding apparatus for vertically holding a substrate to be exposed by radiation includes a substrate holding member for attracting a substrate and engaging means for engaging the substrate on the substrate holding member. The engaging means is retractably supported by or fixed to the substrate holding member, and engages the substrate in such a manner that the engagement between the vertically held substrate and the engaging means is maintained even if the substrate holding member ceases to attract the substrate.

These advantages and others will be more readily understood in connection with the following detailed description, claims and drawings.

DETAILED DESCRIPTION OF THE PREFERRED EMBODIMENT

Figure 3A:
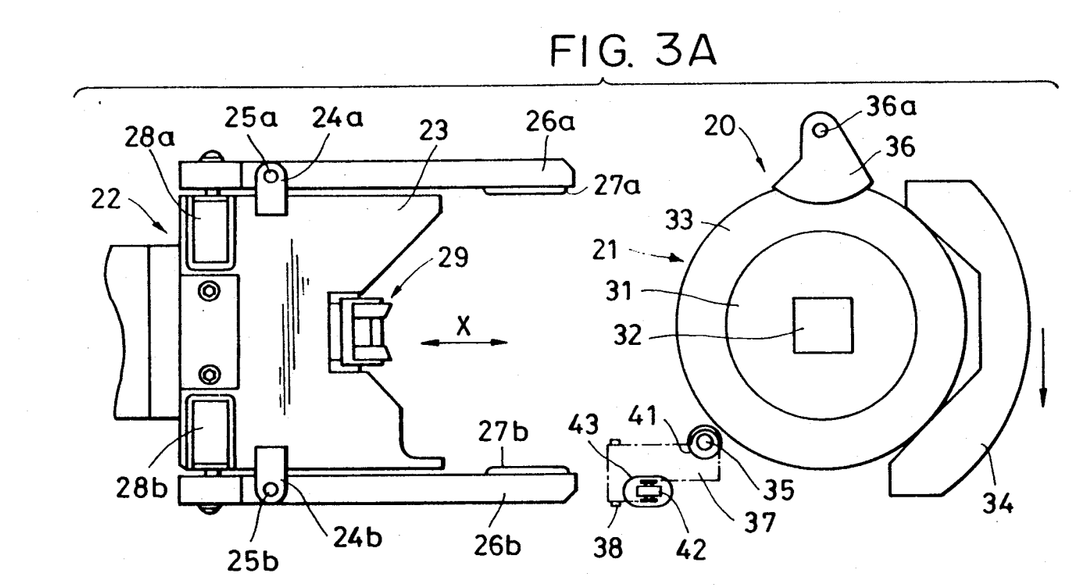
FIG. 3A is a front view of a first embodiment of the present invention.
Figure 3B:
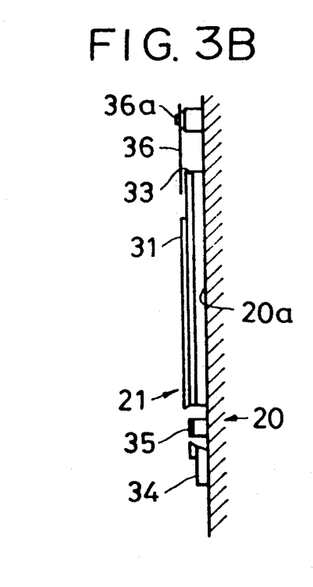
FIG. 3B is a side view of the first embodiment of the present invention.
Figure 3C:
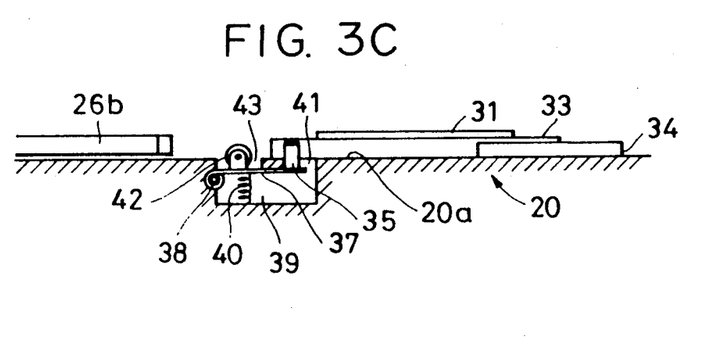
FIG. 3C is a bottom view of the first embodiment of the present invention.

FIGS. 3A-3C show a first embodiment of a substrate holding apparatus according to the present invention. In FIGS. 3A-3C, there are provided a mask stage 20 for attracting and holding an X-ray mask 21 acting as a substrate holding apparatus and a mask hand 22 for holding and transporting the X-ray mask 21 acting as a substrate transporting apparatus.

The mask hand 22 for holding the X-ray mask 21 will now be explained.

A hand body 23 of the mask hand 22 has a shape of a rectangular letter C, and on both sides of the hand body 23, supporting portions 24a and 24b are disposed so as to project parallel to the surface of the mask 21 to be held. Pins 25a and 25b are studded on the supporting portions 24a and 24b, and finger portions 26a and 26b are pivotally supported by the pins 25a and 25b. Engaging pieces 27a and 27b are fixed to inner ends of the finger portions 26a and 26b, for holding the X-ray mask 21 positively. At the other ends of the finger portions 26a and 26b, there are provided between the hand body 23 and the finger portions 26a and 26b compression springs (not shown) for always biasing the finger portions 26a and 26b in a direction which closes the finger portions 26a and 26b, and solenoids 28a and 28b for driving the finger portions 26a and 26b against the forces of the compression springs in a direction which opens the finger portions 26a and 26b. By controlling the solenoids 28a and 28b, the two finger portions 26a and 26b of the mask hand 22 are opened and closed. In an inner recess of the hand body 23 a magnetic attracting unit 29 is disposed for magnetically attracting the X-ray mask 21.

The magnetic unit 29 includes a permanent magnet and an electromagnet for generating a magnetic field in a direction which offsets the magnetic force of the permanent magnet, when energized. Thus, the attraction of the X-ray mask 21 is performed by the magnetic force of the permanent magnet, while the disengagement of the mask 21 is performed by energizing the electromagnet to offset the magnetic force of the permanent magnet.

In the X-ray mask 21, a mask membrane 31 having a mask pattern 32 thereon is held by a mask frame 33 in which magnetic material is contained, and the magnetic material of the mask frame 33 is attracted by the magnetic attracting unit 29.

The mask hand 22 is conneccted to a transport apparatus (not shown), and the mask hand 22 holding the mask 21 is moved in an X-direction by the transport apparatus to deliver the mask 21 to or receive the same from the mask stage 20.

Next, the structure of the mask stage 20 will be explained.

A magnetic unit (not shown) including a permanent magnet is embedded in a mask stage surface 20a (FIG. 3B) of the mask stage 20, and the mask 21 is held by attracting the mask frame 33 with the magnetic force of the permanent magnet. The magnetic unit also includes an electromagnet for generating a magnetic force in a direction which offsets the magnetic force of the permanent magnet, and the X-ray mask 21 is disengaged from the stage surface 20a by energizing the electromagnet. Further, there are provided on the stage surface 20a a V-shaped block 34 for determining a positioning location at the time of delivering the mask 21 by the mask hand 22, a drop preventing pin 35 for preventing dropping of the mask 21 and a drop preventing plate 36.

The drop preventing pin 35 prevents the mask 21 from falling downward (indicated by the arrow) by gravitational forces, and cooperates with a portion of the V-shaped block 34. The pin 35 is studded on a free end of a support plate 37 pivotally supported by an axis 38 on a side wall of a recess 39 (FIG. 3C) formed in the stage surface 20a. The position of the pin 35 is located opposite to the V-shaped block 34 with respect to the mask 21 and near the lower end of the mask 21. As is shown in FIG. 3C, the support plate 37 is biased upward by a spring 40 in the recess 39. Thus, the drop preventing pin 35 projects above the stage surface 20a through a hole 41. The pin 35 projecting above the stage surface 20a is set to be a little remote from the periphery of the mask 21 so that the pin 35 is not in contact with the mask 21 held by the mask stage 20. Further, there is provided on the support plate 37 near the axis 38 a roller 42 in a path along which the finger portion 26b of the mask hand 22 passes. The roller 43 is also biased by the spring 40 so that the roller 42 projects above the stage surface 20a into the path of the finger portion 26b, through a hole 43 for the roller 42 formed in the stage surface 20a.

As shown in FIG. 3A, the drop preventing plate 36 has a shape of a sector, and is rotatably supported by a pivot pin 36a over the upper portion of the X-ray mask 21 held by the mask stage 20. The length of the plate 36 in a radial direction extends from the pivot pin 36a to a central portion in the width of the mask frame 33, so that a wider portion of the plate 36 overlaps an upper portion of the mask frame 33. Thus, the X-ray mask 21 is prevented from dropping in a leftward direction shown in FIG. 3B, i.e., in a direction opposite to the stage surface 20a.

A case wherein the mask hand 22 is moved onto the mask stage 20 provided with the drop preventing pin 35 and drop preventing plate 36 will be explained referring to FIGS. 4A and 4B.

Figure 4A:
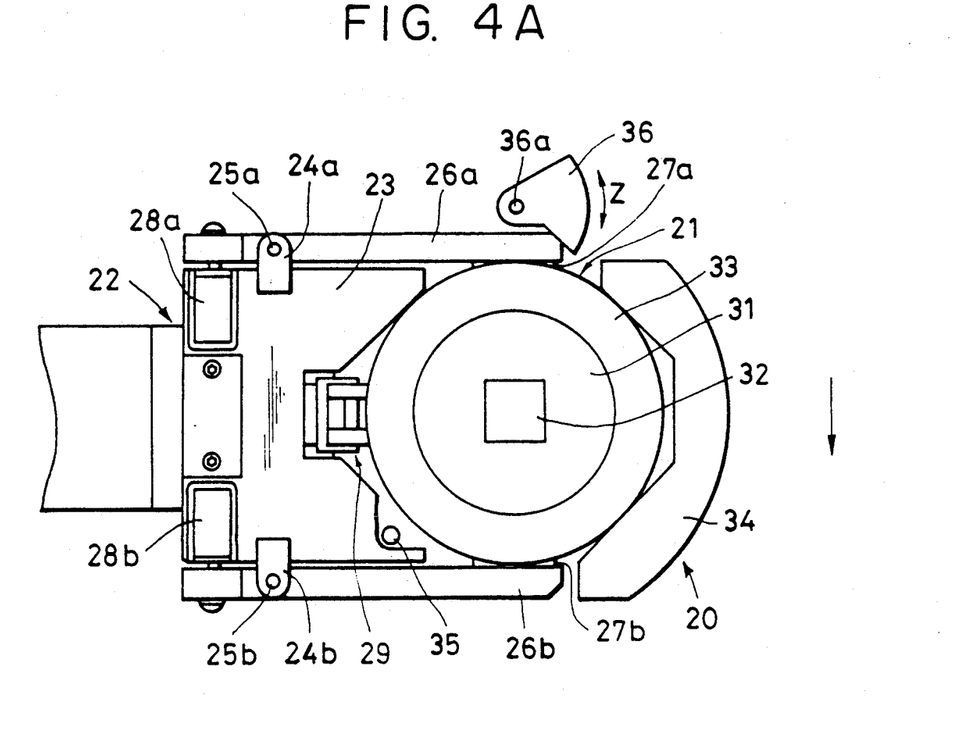
FIG. 4A is a front view of the first embodiment of the present invention in a state in which a mask hand holds an X-ray mask on a mask stage.
Figure 4B:
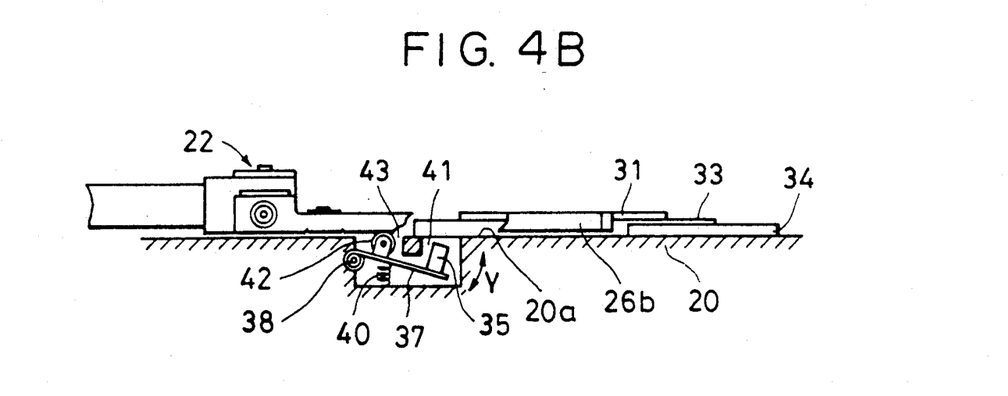
FIG. 4B is a bottom view of the first embodiment of the present invention in the state of FIG. 4A.

FIGS. 4A and 4B are respectively a front and a side view illustrating a state in which the mask hand 22 holds the mask 21 on the mask stage 20.

First, when the mask hand 22 moves onto the mask stage 20, the finger portion 26b comes into contact with the roller 42 projecting above the stage surface 20a. As the mask hand 22 further moves, the roller 42 rotates and the finger portion 26b moves while the surface of the finger portion 26b opposed to the stage surface 20a is in contact with an upper side of the roller 42. Hence, the roller 42 is pushed downward agaist the biasing force of the spring 40. Due to this, the drop preventing pin 35, which is mounted on the support plate 37 together with the roller 42 and projects above the stage surface 20a, also is pushed downward and takes a retracted state from the stage surface 20a. On the other hand, the other finger portion 26a abuts the side of the drop preventing plate 36. Therefore, as the mask hand 22 moves, the plate 36 is pushed up in a Z-direction, and the plate 36 also takes a retracted state from the stage surface 20a, similar to the drop preventing pin 35.

The state in which the drop preventing pin 35 is forced downward continues until the mask hand 22 retracts from the mask stage 20 and the finger portion 26b leaves the roller 42. When the entire mask hand 22 is retracted from the mask stage 20 and the finger portion 26b leaves the roller 42, the roller 42 and the pin 35 are returned to an original state by the force of the spring 40 as shown in FIG. 3C and they project above the stage surface 20a. The drop preventing plate 36 gradually descends by its own weight as the mask hand 22 retracts. When the mask hand 22 retracts from the mask stage 20 and the finger portion 26a leaves the plate 36, the plate 36 becomes pendent from the pivot pin 36a as shown in FIG. 3A.

Therefore, when the X-ray mask 21 is delivered to the mask stage 20, there is no obstacle to move the mask hand 22 for delivering the mask 21 since the drop preventing pin 35 and the drop preventing plate 36 are retracted from the mask stage 20 as the mask hand 22 moves. Further, after the mask 21 is delivered to the mask stage 20 and the mask hand 22 is retracted from the mask stage 20, even if the attraction of the mask 21 ceases due to an erroneous operation of the magnetic unit embedded in the stage surface 20a and the like, the mask 21 is received by the pin 35 projecting above the stage surface 20a and the plate 36 depending from the pivot pin 36a and dropping of the mask 21 is prevented.

The arrangement of the pin 35 and the roller 42 disposed on the support plate 37 must be as follows. When the mask hand 22 holding the X-ray mask 21 is moved onto the mask stage 20, before the periphery of the mask 21 comes into contact with the drop preventing pin 35, the finger portion 26b of the mask hand 22 should come in contact with the roller 42 to depress the pin 35 by pushing down the roller 42. Further, the distance between the drop preventing pin 35 and the periphery of the mask 21 attracted by the mask stage 20 must be as follows, considering the radius of the drop preventing plate 36. When the pin 35 receives the mask 21, at least a lower end portion of the plate 36 should overlap the mask frame 33 as shown in FIG. 3B.

The distance between the drop preventing pin 35 and the mask frame 33 is required so that the pin 35 does not engage the mask frame 33, to not cause positional shift of the mask 21 when the pin 35 moves up and down or when there is an error or the like in the size of the mask frame 33.

Next, a second embodiment according to the present invention will be described referring to FIGS. 5A-5C.

Figure 5A:
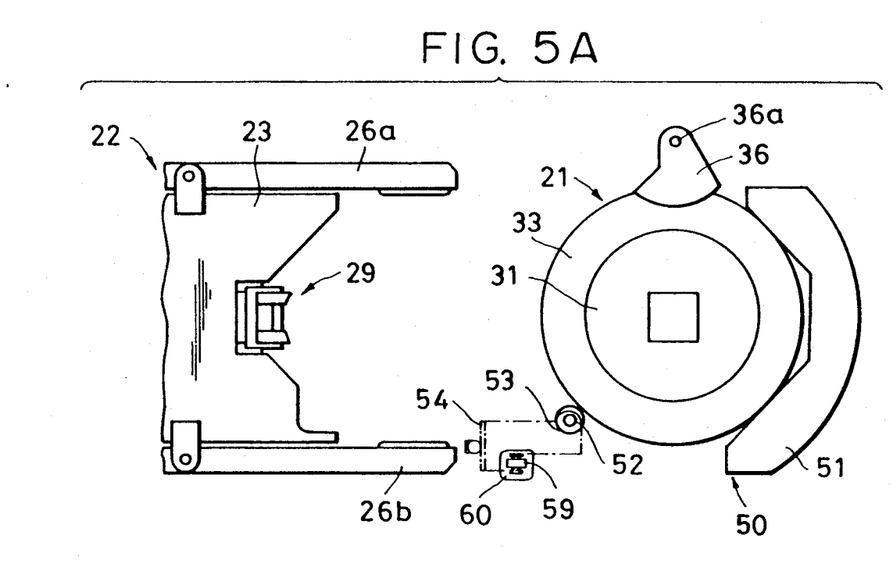
FIG. 5A is a front view of a second embodiment of the present invention.
Figure 5B:
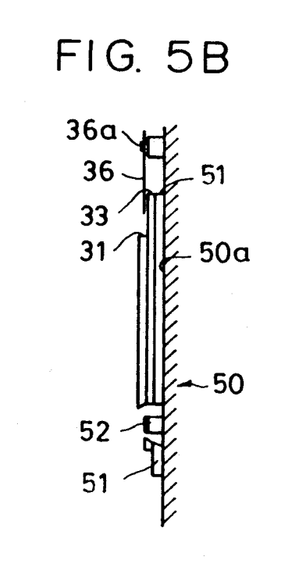
FIG. 5B is a side view of the second embodiment of the present invention.
Figure 5C:
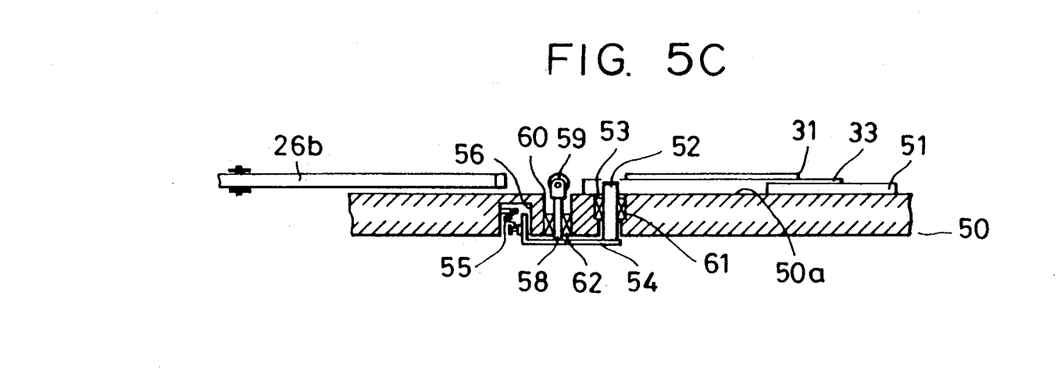
FIG. 5C is a bottom view of the second embodiment of the present invention.

FIGS. 5A-5C show a second embodiment of a substrate holding apparatus according to the present invention. FIGS. 5A-5C are respectively front, side and bottom views of the second embodiment, and show a state in which a mask stage 50 holds the X-ray mask 21. The same reference numerals as those in FIGS. 3A-3C denote the same elements as those therein.

The mask stage 50 attracts the mask 21 by a magnetic unit (not shown) embedded in a stage surface 50a similar to the first embodiment. On the stage surface 50a, there are provided a V-shaped block 51, the drop preventing plate 36 and a drop preventing pin 52.

The pin 52 projects above the stage surface 50a through a hole 53 formed at a portion of the mask stage 50 opposite to the V-shaped block 51 with respect to the mask 21.

The drop preventing pin 52 is studded on a free end of an L-shaped support plate 54 biased upward by a tension spring 55 fixed in a recess 56 of the mask stage 50. The pin 52 projects above the stage surface 50a through the hole 53 by the force of the tension spring 55. The support plate 54 is supported by the spring 55 on its one end, and the pin 52 is studded on its other end. There is provided a roller support rod 58 with a roller 59 at its tip between the one end and the other end. The roller 59 projects into a path along which the finger portion 26b passes, through a hole 60 for the roller 59 formed in the mask stage 50. In the hole 53 for the pin 52 and the hole 60 for the roller 59, there are respectively provided translation bearings 61 and 62 for translationally guiding the pin 52 and the rod 58. The pin 52 and the rod 58 are vertically guided upward and downward relative to the stage surface 50a by the translational bearings 61 and 62.

A case wherein the mask hand 22 is moved onto the mask stage 50 provided with the drop preventing pin 52 and drop preventing plate 36 will be explained referring to FIGS. 6A and 6B.

Figure 6A:
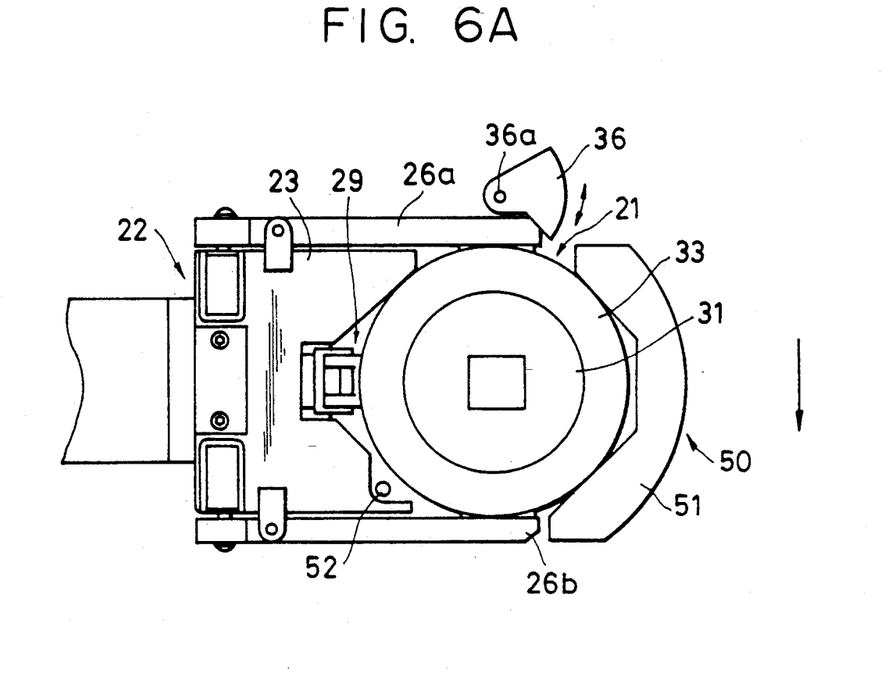
FIG. 6A is a front view of the second embodiment of the present invention in a state in which a mask hand holds an X-ray mask stage.
Figure 6B:
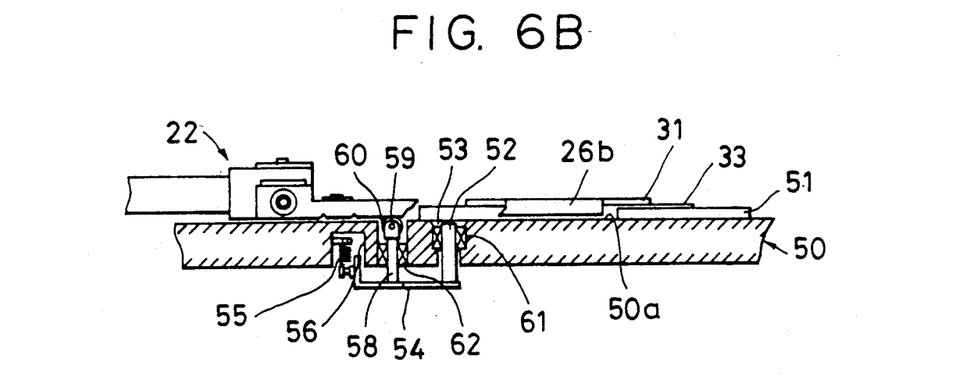
FIG. 6B is a bottom view of the second embodiment of the present invention in the state of FIG. 6A.

FIGS. 6A and 6B are respectively a front and a side view illustrating a state in which the mask hand 22 holds the mask 21 on the mask stage 50.

First, when the mask hand 22 moves onto the mask stage 50, the finger portion 26b comes into contact with the roller 59 projecting above the stage surface 50a. As the mask hand 22 further moves, the roller 59 rotates and the finger portion 26b moves while the surface of the finger portion 26b opposed to the stage surface 50a is in contact with an upper side of the roller 59. Hence, the roller 59 is pushed downward against the biasing force of the spring 55. Due to this, the drop preventing pin 52, which is mounted on the support plate 54 together with the roller 59 and projects above the stage surface 50a, is also pushed downward as shown in FIG. 6B. On the other hand, the other finger portion 26a abuts the side of the drop preventing plate 36. Therefore, as the mask hand 22 moves, the plate 36 is pushed up and the plate 36 also takes a retracted state from the stage surface 50a, similar to the drop preventing pin 52.

The state in which the drop preventing pin 52 is forced downward continues until the mask hand 22 retracts from the mask stage 50 and the finger portion 26b leaves the roller 59. When the entire mask hand 22 is retracted from the mask stage 50 and the finger portion 26b leaves the roller 59, the roller 59 and the pin 52 are returned to an original state by the tension force of the spring 55 as shown in FIG. 5C and they project above the stage surface 50a. The drop preventing plate 36 gradually descends by its own weight as the mask hand 22 retracts. When the mask hand 22 retracts from the mask stage 50 and the finger portion 26a leaves the plate 36, the plate 36 returns to a state in which the plate 36 is pendent from the pivot pin 36a as shown in FIG. 5A.

Therefore, when the X-ray mask 21 is delivered to the mask stage 50, there is no obstacle to move the mask hand 22 for delivering the mask 21 since the drop preventing pin 52 and the drop preventing plate 36 are retracted from the stage surface 50a of the mask stage 50 as the mask hand 22 moves. Further, after the mask 21 is delivered to the mask stage 50 and the mask hand 22 is retracted from the mask stage 50, even if the attraction of the mask 21 ceases due to an erroneous operation of the magnetic unit embedded in the stage surface 50a and the like, the mask 21 is received by the pin 52 projecting above the stage surface 50a and the plate 36 depending from the pivot pin 36a and dropping of the mask 21 is prevented.

In the second embodiment, there are respectively disposed the translational bearings 61 and 62 between the drop preventing pin 52 and the hole 53 and between the roller support rod 58 and the hole 60, so that the pin 52 and the roller 59 move upward and downward vertically relative to the stage surface 50a. While the tension spring 55 supports one end of the support plate 54 on which the pin 52 and the roller support rod 58 are studded, in the second embodiment, the spring 55 may support an intermediate portion between the pin 52 and the rod 58.

Next, a third embodiment according to the present invention will be described referring to FIGS. 7A, 7B and 8.

Figure 7A:
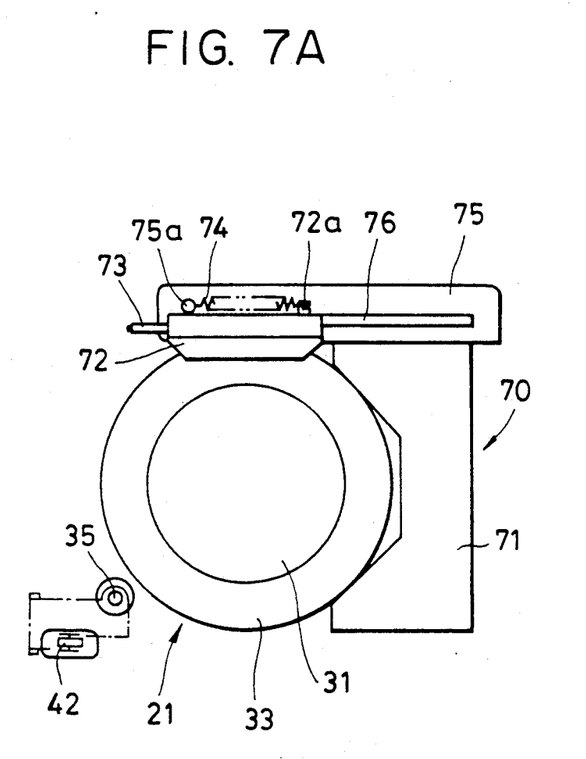
FIG. 7A is a front view of a third embodiment of the present invention.
Figure 7B:
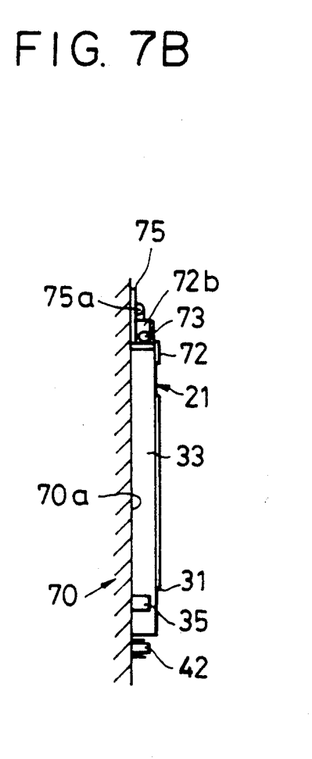
FIG. 7B is a side view of the third embodiment of the present invention.
Figure 8:
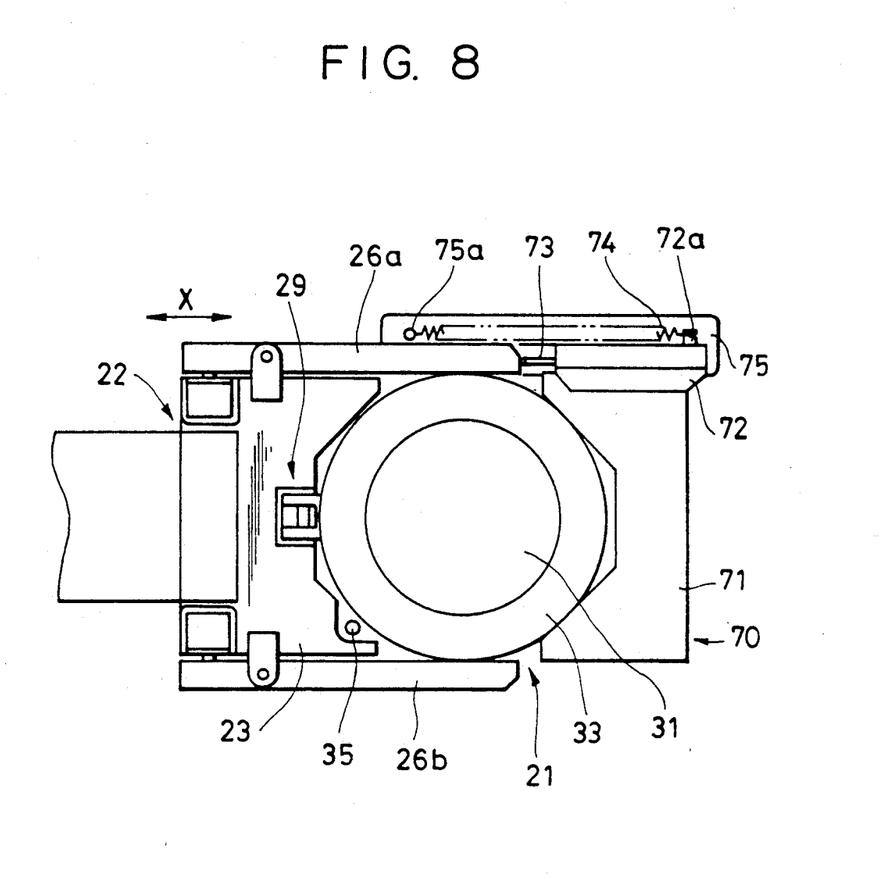
FIG. 8 is a front view of the third embodiment of the present invention in a state in which a mask hand holds an X-ray mask on a mask stage.

FIGS. 7A and 7B are respectively a front and a side view of the third embodiment, and show a state in which a mask stage 70 holds the X-ray mask 21. FIG. 8 is a front view showing a state in which the mask hand 22 holds the mask 21 on the mask stage 70. The same reference numerals as those in FIGS. 3A-3C denote the same elements as those therein.

A mask stage 70 of this embodiment also attracts the mask 21 by a magnetic unit (not shown) embedded in a stage surface 70a similar to the first and second embodiments. On the stage surface 70a, there are provided a V-shaped block 71, a drop preventing plate 72 and the drop preventing pin 35.

The pin 35 projects above the stage surface 70a similar to that of the first embodiment. The drop preventing plate 72 is slidably supported by a support member 75 fixed to a portion of the stage surface 70a above the X-ray mask 21 held by the mask stage 70 and the V-shaped block 71.

In the support member 75, a guide 76 is formed extending between a portion above the mask 21 and a portion above the V-shaped block 71 parallel to a direction in which the mask hand 22 moves (the X-direction). A base 72b to which the drop preventing plate 72 of a trapezoidal shape is fixed (see FIG. 7B) slidably engages the guide 76. On the base 72b on the mask hand side, a pin 73 is provided for engaging a tip of the finger portion 26a when the mask hand 22 moves onto the mask stage 70. The base 72b is biased by a tension spring 74 spanned between a spring support portion 72a fixed to the base 72b and a spring support portion 75a fixed to a left side portion of the support member 75, so that the drop preventing plate 72 partially overlaps an upper side portion of the mask 21 normally as shown in FIG. 7A.

When the mask hand 22 is moved onto the mask stage 70, the finger portion 26b comes into contact with the roller 42 to depress the roller 42 and the finger portion 26a abuts the pin 73. Then, as the mask hand 22 advances, the finger portion 26a moves pushing the pin 73 against the spring force of the tension spring 74. Finally, when the mask hand 22 reaches a position at which the X-ray mask 21 is delivered, the drop preventing plate 72 is moved to a location (a right end side of the guide 76) above the V-shaped block 71 as shown in FIG. 8. Thereafter, when the mask hand 22 leaves the mask stage 70, the drop preventing plate 72 gradually returns to the state shown in FIG. 7A due to the force of the tension spring 74. Therefore, also in the third embodiment, the drop preventing pin 35 and the plate 72 will not disturb the movement of the mask hand 22 at a time of delivering the mask 21. Thus, advantages similar to those of the first and second embodiments can be obtained.

In the above-discussed structure, the drop preventing pin 35 of the first embodiment is used, but that of the second embodiment may be used. Further, in the third embodiment, there is provided the substrate holding apparatus which holds the substrate by attracting it with a magnetic force of a magnetic unit, but a vacuum attracting type may be used.

Figure 9:
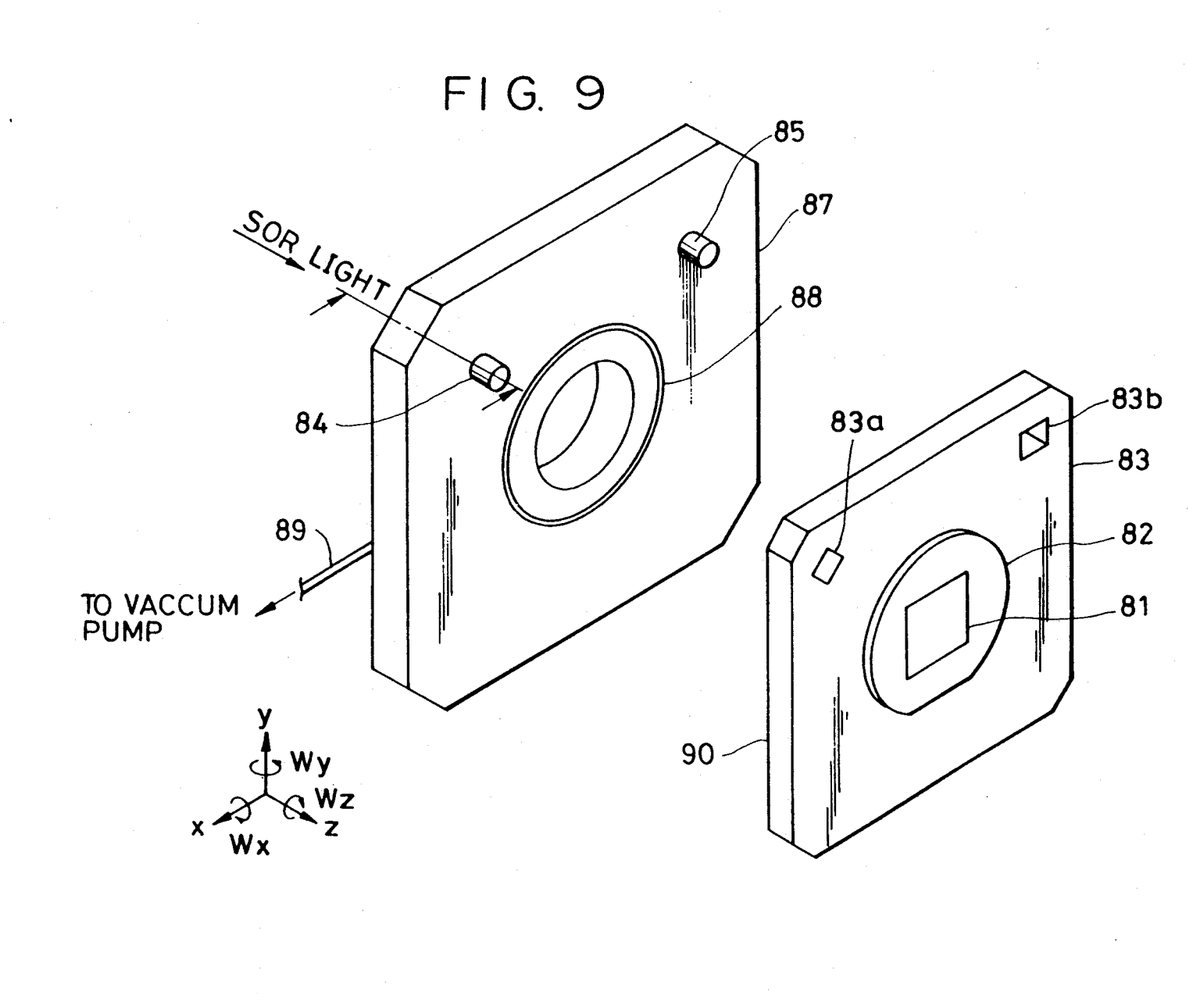
FIG. 9 is a perspective view of a fourth embodiment of the present invention.

FIG. 9 shows a fourth embodiment of the present invention.

In the fourth embodiment, there are provided an X-ray mask structure for use in the exposure with synchrotron radiation and a mask stage base including a means for attracting the mask structure. In FIG. 9, reference numeral 82 is a mask substrate on which a mask pattern 81 such as a highly integrated circuit pattern is depicted, and reference numeral 83 is a support frame formed with heat resisting glass or metal. The mask substrate 82 and the support frame 83 are adhered to each other by adhesive to form a mask structure 90. There are provided, on a mask stage base 87 for attracting the X-ray mask structure 90, a groove 88 for vacuum attraction connected to a vacuum pump (not shown) through a line tube 89 and two positioning pins 84 and 85. The positioning pins 84 and 85 stand on the mask stage base 87 with a distance therebetween in a horizontal direction. Two rectangular holes 83a and 83b are formed in the support frame 83 for receiving the respective positioning pins 84 and 85. Since the exposure operation is performed standing the mask structure 90 and the mask stage base 87 vertically, the rectangular hole 83b is shaped so that each side thereof becomes horizontal or vertical at a time of the exposure, while the rectangular hole 83a has an orientation which is obtained by rotating the hole 83b by 45 degrees.

In the fourth embodiment, in order to position the X-ray mask structure 90 on the mask stage base 87 and hold the mask structure 90, the mask structure 90 is hung by fitting the positioning pins 84 and 85 into the respective holes 83a and 84b and is then vacuum-attracted by the groove 88. The positioning pin 85 is in contact with the hole 83b on one side of the hole 83b, and the positioning pin 84 is in contact with the hole 83a on two sides of the hole 83a. So, the mask structure 90 is positioned at three points in the hanging state, and the positioning is completed in each of the Z, $W_x$ and $W_y$-directions. Further, when the mask structure 90 is attracted onto the mask stage base 87 by vacuum attraction, the positioning in each of the Z, $W_x$ and $W_y$-directions is performed and the mask structure 90 is held in an accurately positioned state.

Thus, in the fourth embodiment, the X-ray mask structure 90 is vacuum-attracted after being hung by the pins 84 and 85, so that the mask structure 90 will not fall even if the attraction is lost owing to failures in the line tube 89, vacuum pump and other reasons. Hence, its reliability is increased.

In the above-discussed structure, the vacuum-attracting system is used, but an attracting system using a magnetic force may be used.

Figure 10:
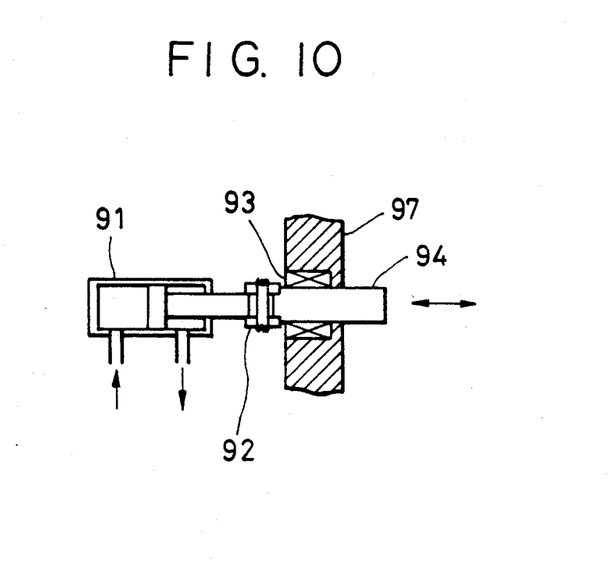
FIG. 10 is a partial cross-sectional view of a fifth embodiment of the present invention.

FIG. 10 shows a partial view of a fifth embodiment of the present invention.

While the positioning pins 84 and 85 are fixed to the mask stage base 87 in the fourth embodiment, positioning pins 94 (only one is illustrated in FIG. 10) are movable by a moving mechanism in the fifth embodiment.

In FIG. 10, the positioning pin 94 is coupled to a piston of an air cylinder 91 by a coupling 92, and the positioning pin 94 is slidably supported by a mask stage base 97 through a bearing 93. The positioning pin 94 is reciprocated in the direction indicated by the double-neck arrow by the air cylinder 91.

In the fifth embodiment, when the X-ray mask structure 90 is to be transported onto the mask stage base 97 by the mask hand, the positioning pin 94 is moved to a retracted position by the air cylinder 91. When the transportation of the mask structure 90 onto the mask stage base 97 is completed, the positioning pin 94 is in turn moved to a projecting state. Thus, the mask structure 90 is hung by the positioning pins 94, and then is attracted by vacuum.

Figure 11:
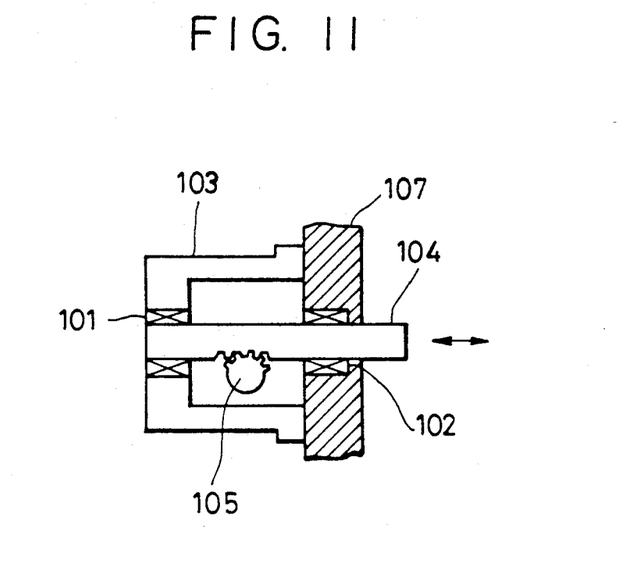
FIG. 11 is a partial cross-sectional view of a sixth embodiment of the present invention.

FIG. 11 shows a partial view of a sixth embodiment of the present invention.

In the sixth embodiment, positioning pins 104 (only one is illustrated in FIG. 11) is movable by a moving mechanism similar to the fifth embodiment.

In FIG. 11, reference numeral 104 represents the movable positioning pin having a round rack gear on its central part, reference numerals 101 and 102 represent bearings for guiding the pin 104 at both its ends, reference numeral 103 represents a housing, reference numeral 105 represents a pinion which engages the round rack of the positioning pin 104 and is driven by a motor (not shown) and reference numeral 107 represents a mask stage base.

In the structure, when the pinion 105 is rotated in a counterclockwise direction, the positioning pin 104 is retracted, but is projected when the pinion 105 is rotated in a clockwise direction. The operation timing is the same as that of the fifth embodiment.

In the fifth and sixth embodiments, a stroke in a mounting direction by a height of the positioning pin is not required for a mask transporting device such as a mask hand, so that the amount of movement required for the transporting device or the mask stage base can be reduced. Further, the apparatus can be made compact in size.

While there have been shown and described what are considered preferred embodiments of the present invention, it will be obvious to those skilled in the art that various changes and modifications may be made therein without departing from the invention as defined by the following claims.

What is claimed is:

1. A substrate holding apparatus for vertically holding a substrate to be exposed by radiation, which is transported by a substrate transporting apparatus having two finger portions for holding the substrate, said apparatus comprising:

a substrate holding surface for attracting a substrate;

a drop preventing pin biased so as to project above said substrate holding surface to prevent dropping of the substrate, said pin being depressed below said substrate holding surface by one of the finger portions of the substrate transporting apparatus when the substrate transporting apparatus moves onto said substrate holding surface; and a drop preventing plate, movably supported at and biased toward a home position in which said plate overlaps an upper portion of the substrate attracted by said substrate holding surface, for receiving the substrate when leaning to a side opposite to the substrate holding surface, said plate being retracted from said substrate holding surface by the other one of the finger portions of the substrate transporting apparatus when the substrate transporting apparatus moves onto said substrate holding surface.

2. A substrate holding apparatus according to claim 1, further comprising a support plate pivotally supported at one of its ends in a recess of said substrate holding surface and biased toward said substrate holding surface thereabove, said drop preventing pin protruding from the other end of said support plate; and a roller protruding from on a portion of the end of said support plate, said roller projecting above the substrate holding surface into a path along which the one of the finger portions of the substrate transporting apparatus travels.

3. A substrate holding apparatus according to claim 1, further comprising a support plate biased toward said substrate holding surface thereabove, said drop preventing pin protruding from one end of said support plate; and a roller support rod including a roller protruding from a portion of said support plate at its other end, said roller projecting into a path above the substrate holding surface along which the one of the finger portions of the substrate transporting apparatus travels.

4. A substrate holding apparatus according to claim 1, wherein said drop preventing plate is mounted for pivotal movement.

5. A substrate holding apparatus according to claim 1, wherein said drop preventing plate is horizontally slidable and biased toward the home position.

6. A substrate holding apparatus according to claim 1, further comprising a block for positioning and supporting the substrate, said block being fixed to said substrate holding surface at a position opposite to said drop preventing pin with respect to the substrate on said substrate holding surface.

7. A substrate holding apparatus according to claim 1, wherein said substrate holding surface attracts the substrate by a magnetic force.

8. A substrate holding apparatus according to claim 1, wherein said substrate holding surface attracts the substrate by a vacuum force.

9. A substrate holding apparatus for vertically holding a substrate, said apparatus comprising:
a holding surface for attracting and vertically holding the substrate; and
drop preventing means for preventing dropping of the substrate, said drop preventing means being positioned at a position where dropping of the substrate is prevented, and wherein said drop preventing means is adapted to be retracted from the first position to a second position where movement of the substrate is not hindered when the substrate moves onto said holding surface.

10. An apparatus according to claim 9, wherein said drop preventing means comprises means for being pushed by a transporting hand of the substrate and to retract from the first position to the second position.

11. An apparatus according to claim 9, wherein said drop preventing means comprises a drop preventing pin biased so as to project above said substrate holding surface to prevent dropping of the substrate, said pin being depressed below said holding surface when the substrate moves onto said holding surface.

12. An apparatus according to claim 9, wherein said drop preventing means comprises a drop preventing plate, movably supported at and biased toward a home position in which said plate overlaps an upper portion of the substrate attracted by said holding surface, for receiving the substrate when leaning to a side opposite to said holding surface, said plate being retracted from said holding surface when the substrate moves onto said holding surface.

13. A substrate holding apparatus for vertically holding a substrate, said apparatus comprising:
a holding surface for attracting and vertically holding the substrate; and
two positioning pins located on said holding surface with a predetermined distance therebetween along a horizontal direction, said two pins being fitted into holes formed in the substrate and wherein the substrate is positioned by gravitational force, and after positioning, the substrate is attracted and held by said holding surface.

14. An apparatus according to claim 13, wherein one of said positioning pins is in contact with a corresponding hole on one side of the hole, and the other of said positioning pins is in contact with a corresponding hole on two sides of the hole, so that the substrate is positioned.

15. An apparatus according to claim 13, further comprising a moving mechanism for projecting and retracting said two pins toward and from said holding surface.

16. An apparatus according to claim 13, wherein said holding surface attracts the substrate by either one of a magnetic force and a vacuum force.

* * * * *